US012813208B2

(12) United States Patent
Yerushalmi et al.

(10) Patent No.: US 12,813,208 B2
(45) Date of Patent: Nov. 24, 2026

(54) CONTINUOUS MACHINE LEARNING MODEL TRAINING FOR SEMICONDUCTOR MANUFACTURING

(71) Applicant: KLA CORPORATION, Milpitas, CA (US)

(72) Inventors: Liran Yerushalmi, Zicron Yaacob (IL); Alexander Kuznetsov, Austin, TX (US)

(73) Assignee: KLA COPORATION, Milpitas, CA (US)

( * ) Notice: Subject to any disclaimer, the term of this patent is extended or adjusted under 35 U.S.C. 154(b) by 1048 days.

(21) Appl. No.: 17/510,307

(22) Filed: Oct. 25, 2021

(65) Prior Publication Data

US 2023/0128610 A1 Apr. 27, 2023

(51) Int. Cl.

*G06N 3/08* (2023.01)
*G06F 17/18* (2006.01)
*G06N 3/045* (2023.01)
*H10P 72/00* (2026.01)

(52) U.S. Cl.

CPC .......... *H10P 72/0616* (2026.01); *G06F 17/18* (2013.01); *G06N 3/045* (2023.01); *G06N 3/08* (2013.01)

(58) Field of Classification Search

CPC ......... H01L 21/67288; H01L 21/67242; G06F 17/18; G06N 3/045; G06N 3/08; G06N 3/0455; G06N 3/0464; G06N 3/047; G06N 3/0475

See application file for complete search history.

(56) References Cited

U.S. PATENT DOCUMENTS 10,095,121 B2 10/2018 Holovinger et al.
10,101,670 B2 10/2018 Pandev et al.
10,152,654 B2 12/2018 Pandev et al.
10,712,145 B2 7/2020 Chen et al.
10,943,838 B2 3/2021 Hoo et al.
2003/0154450 A1* 8/2003 Naffziger .............. G06F 9/3836 716/112
2004/0030437 A1* 2/2004 Toh ................... H01L 21/67276 700/121

(Continued)

FOREIGN PATENT DOCUMENTS

CN 110596146 A 12/2019
EP 3299890 A1 * 3/2018 ............. G03F 7/705

(Continued)

OTHER PUBLICATIONS

Enhancing Scalability of Virtual Metrology: A Deep Learning-Based Approach for Domain Adaptation, Natalie Gentner et al., 2020 Winter Simulation Conference (Year: 2020).*

(Continued)

*Primary Examiner* — Oluwatosin Alabi

(74) *Attorney, Agent, or Firm* — Hodgson Russ LLP

(57) ABSTRACT

Two machine learning modules or models are used to generate a recipe. A first machine learning module determines a set of recipes based on measured signals. The second machine learning module analyzes the set of recipes based on a cost function to determine a final recipe. The second machine learning module also can determine settings if the set of recipes fail evaluation using the cost function.

22 Claims, 4 Drawing Sheets

(56) References Cited

U.S. PATENT DOCUMENTS

| | | | | |
|---|---|---|---|---|
| 2005/0192914 | A1* | 9/2005 | Drege | G06N 20/00 706/12 |
| 2005/0228765 | A1* | 10/2005 | Huang | G06F 16/93 |
| 2006/0051681 | A1* | 3/2006 | Taylor | G03F 1/72 430/323 |
| 2007/0067134 | A1* | 3/2007 | Borowicz | G06T 7/0004 702/127 |
| 2007/0230770 | A1* | 10/2007 | Kulkarni | G06T 7/33 382/149 |
| 2008/0312858 | A1* | 12/2008 | Baseman | G05B 19/41875 702/83 |
| 2009/0228408 | A1* | 9/2009 | Kaushal | G06N 5/04 714/26 |
| 2014/0376802 | A1* | 12/2014 | Wu | G06T 7/0004 382/149 |
| 2017/0045356 | A1 | 2/2017 | Pandev et al. | |
| 2018/0112968 | A1* | 4/2018 | Chen | G01N 23/201 |
| 2018/0188717 | A1* | 7/2018 | Chen | G05B 19/0426 |
| 2018/0218493 | A1* | 8/2018 | Zhang | G06T 7/0006 |
| 2019/0214285 | A1 | 7/2019 | Pandev et al. | |
| 2020/0083080 | A1* | 3/2020 | Clark | H01L 21/76834 |
| 2021/0263405 | A1* | 8/2021 | Stanton | G03F 7/70441 |
| 2021/0404065 | A1* | 12/2021 | Jiang | H01J 37/32165 |
| 2021/0405544 | A1* | 12/2021 | Werkman | G03F 7/70491 |
| 2022/0050061 | A1* | 2/2022 | Bar | G03F 7/706841 |
| 2022/0207681 | A1* | 6/2022 | Kris | G03F 7/70625 |
| 2023/0051330 | A1* | 2/2023 | Cantwell | G05B 19/41885 |
| 2023/0091058 | A1* | 3/2023 | Cantwell | G05B 13/0265 700/97 |
| 2023/0095532 | A1* | 3/2023 | Sasajima | G05B 23/0281 702/183 |

FOREIGN PATENT DOCUMENTS

| | | | | |
|---|---|---|---|---|
| KR | 20210075156 | A | 6/2021 | |
| TW | 202045911 | A | 12/2020 | |
| TW | 202139078 | A | 10/2021 | |
| WO | 2020234863 | A1 | 11/2020 | |
| WO | 2021016407 | A1 | 1/2021 | |
| WO | WO-2021081213 | A1 * | 4/2021 | G06F 30/27 |

OTHER PUBLICATIONS

SEERL : Sample Efficient Ensemble Reinforcement Learning, Rohan Saphal et al., arXiv:2001.05209v2 [cs.LG] May 16, 2021 (Year: 2021).*

Tin TC, Tan SC, Yong H, Kim JO, Teo EK, Lee CK, Than P, San Tan AP, Phang SC. A realizable overlay virtual metrology system in semiconductor manufacturing: Proposal, challenges and future perspective. IEEE Access. Apr. 28, 2021;9:65418-39. (Year: 2021).*

Shiely JP. Machine learning for compact lithographic process models. InMachine Learning in VLSI Computer-Aided Design Mar. 16, 2019 (pp. 19-68). Cham: Springer International Publishing. (Year: 2019).*

Shim J, Cho S, Kum E, Jeong S. Adaptive fault detection framework for recipe transition in semiconductor manufacturing. Computers & Industrial Engineering. 2021 (Year: 2021).*

Susto GA, Pampuri S, Schirru A, De Nicolao G, McLoone SF, Beghi A. Automatic control and machine learning for semiconductor manufacturing: Review and challenges. InProceedings of the 10th European Workshop on Advanced Control and Diagnosis (ACD 2012) 2012. (Year: 2012).*

Chen et al., "Applications for Machine Learning in Semiconductor Manufacturing and Test," Electron Devices Technology and Manufacturing Conference (EDTM), Jun. 22, 2021.

WIPO, International Search Report for International Application No. PCT/US2022/047069, Feb. 17, 2023.

WIPO, Written Opinion of the International Searching Authority for International Application No. PCT/US2022/047069, Feb. 17, 2023.

TIPO, Office Action issued in ROC (Taiwan) Patent Application No. 111124425, Apr. 9, 2025.

* cited by examiner

CONTINUOUS MACHINE LEARNING MODEL TRAINING FOR SEMICONDUCTOR MANUFACTURING

FIELD OF THE DISCLOSURE

This disclosure relates to semiconductor inspection and metrology.

BACKGROUND OF THE DISCLOSURE

Evolution of the semiconductor manufacturing industry is placing greater demands on yield management and, in particular, on metrology and inspection systems. Critical dimensions continue to shrink, yet the industry needs to decrease time for achieving high-yield, high-value production. Minimizing the total time from detecting a yield problem to fixing it maximizes the return-on-investment for a semiconductor manufacturer.

Fabricating semiconductor devices, such as logic and memory devices, typically includes processing a semiconductor wafer using a large number of fabrication processes to form various features and multiple levels of the semiconductor devices. For example, lithography is a semiconductor fabrication process that involves transferring a pattern from a reticle to a photoresist arranged on a semiconductor wafer. Additional examples of semiconductor fabrication processes include, but are not limited to, chemical-mechanical polishing (CMP), etching, deposition, and ion implantation. An arrangement of multiple semiconductor devices fabricated on a single semiconductor wafer may be separated into individual semiconductor devices.

Inspection processes are used at various steps during semiconductor manufacturing to detect defects on wafers to promote higher yield in the manufacturing process and, thus, higher profits. Inspection has always been an important part of fabricating semiconductor devices such as integrated circuits (ICs). However, as the dimensions of semiconductor devices decrease, inspection becomes even more important to the successful manufacture of acceptable semiconductor devices because smaller defects can cause the devices to fail. For instance, as the dimensions of semiconductor devices decrease, detection of defects of decreasing size has become necessary because even relatively small defects may cause unwanted aberrations in the semiconductor devices.

Defect review typically involves re-detecting defects that were detected by an inspection process and generating additional information about the defects at a higher resolution using either a high magnification optical system or a scanning electron microscope (SEM). Defect review is typically performed at discrete locations on specimens where defects have been detected by inspection. The higher resolution data for the defects generated by defect review is more suitable for determining attributes of the defects such as profile, roughness, or more accurate size information.

Metrology processes are also used at various steps during semiconductor manufacturing to monitor and control the process. Metrology processes are different than inspection processes in that, unlike inspection processes in which defects are detected on wafers, metrology processes are used to measure one or more characteristics of the wafers that cannot be determined using existing inspection tools. Metrology processes can be used to measure one or more characteristics of wafers such that the performance of a process can be determined from the one or more characteristics. For example, metrology processes can measure a dimension (e.g., line width, thickness, etc.) of features formed on the wafers during the process. In addition, if the one or more characteristics of the wafers are unacceptable (e.g., out of a predetermined range for the characteristic(s)), the measurements of the one or more characteristics of the wafers may be used to alter one or more parameters of the process such that additional wafers manufactured by the process have acceptable characteristic(s).

Conventional techniques of calibrating inspection and metrology tools include mechanical calibration by adjusting various system parameters. For example, the tool may be calibrated by adjusting a focal length of an optical system, adjusting an orientation of polarization, or adjusting other physical system parameters. Some techniques may also perform an optimization procedure to minimize the difference between signals generated by a reference tool and signals generated by a calibrated tool. These optimization procedures are typically limited to adjusting a small number of physical parameters associated with the tool being calibrated until a difference between the signals generated by the tool and a set of reference signals generated by a reference tool are minimized. However, because the optimization procedures typically use a limited number of physical parameters, there may still be differences between the signal produced by the calibrated tool and the reference signals.

Machine learning can be used to select recipes for the inspection or metrology tools. A common way of training a machine learning recipe for a metrology application typically includes an application engineer generating multiple machine learning recipes using different input settings, and then evaluating those recipes based on some pre-defined performance metrics (e.g., as measurement precision, accuracy, goodness of fit). The application engineering then picks the best recipe. Recipes generated using this method have several disadvantages. The recipes can have sub-optimal recipe quality due to the limited number of the input settings when generating the initial set of machine learning recipes. The recipes also can have inconsistent quality because the end results depend on the skill and experience of a person evaluating the initial set of machine learning recipes. Finally, the recipes can take a long time to develop due to a non-optimized set of the initial set of machine learning recipes and the amount of manual work involved in evaluating the initial set of machine learning recipes.

Therefore, new systems and techniques are needed.

BRIEF SUMMARY OF THE DISCLOSURE

A system is provided in a first embodiment. The system includes a first machine learning module configured to determine a set of recipes and a second machine learning module configured to determine a final recipe or settings from the set of recipes and a cost function. The first machine learning module receives measured signals. Each recipe in the set of recipes converts the measured signals into parameters of interest. The second machine learning module determines the settings if the set of recipes fails evaluation using the cost function whereby the second machine learning module guides development of the first machine learning module. The second machine learning module determines the final recipe from the set of recipes that passes evaluation using the cost function.

The system can include a tool configured to generate the measured signals. The tool includes a stage configured to hold a wafer, an energy source that directs energy at the wafer on the stage, and a detector that receives the energy reflected from the wafer. The tool can be a semiconductor metrology tool or a semiconductor inspection tool. For example, the energy can be light or electrons.

The second machine learning module can provide the settings to the first machine learning module, use the settings to train the evaluation by the second machine learning module, or use the settings to train the recipe generation by the second machine learning module.

The parameters of interest can include critical dimension, overlay, a material property, or a defect type.

The cost function can be based on one or more of accuracy, precision, total measurement uncertainty, defect capture rate, or measurement time.

The second machine learning module can further evaluate based on the measured signals and/or tool performance metrics.

The first machine learning model and the second machine learning model can each be a neural network model.

A method is provided in a second embodiment. The method includes determining a set of recipes using a first machine learning module based on measured signals. Each recipe in the set of recipes converts the measured signals into parameters of interest. The set of recipes is analyzed with a second machine learning module based on a cost function. The second machine learning module is configured to determine settings if the set of recipes fails evaluation using the cost function or is configured to determine a final recipe from the set of recipes that passes evaluation using the cost function whereby the second machine learning module guides development of the first machine learning module.

The method can further include measuring a semiconductor wafer with a semiconductor metrology tool thereby forming the measured signals. The semiconductor metrology tool can be an optical semiconductor metrology tool or an electron beam semiconductor metrology tool.

The method can further include measuring a semiconductor wafer with a semiconductor inspection tool thereby forming the measured signals. The semiconductor inspection tool can be an optical semiconductor inspection tool or an electron beam semiconductor inspection tool.

The method can further include providing the settings to the first machine learning module, using the settings to train the evaluation by the second machine learning module, or using the settings to train the recipe generation by the second machine learning module.

The method can further include training the second machine learning module to evaluate performance of existing recipes.

The existing recipes can be from at least one different production line running a same product, at least one different production line running a different product, at least one different production line running a different process step, or at least one different production line running a different target.

The method can further include training the second machine learning module to determine the final recipe from the set of recipes. The training can use recipes generated by the first machine learning module.

The parameters of interest can include critical dimension, overlay, a material property, or a defect type.

The cost function can be based on one or more of accuracy, precision, total measurement uncertainty, defect capture rate, or measurement time.

The second machine learning module can further evaluate based on the measured signals and/or tool performance metrics.

The final recipe can be used in production of a semiconductor wafer.

A non-transitory computer readable medium storing a program can be configured to instruct a processor to execute the method of the second embodiment.

DESCRIPTION OF THE DRAWINGS

For a fuller understanding of the nature and objects of the disclosure, reference should be made to the following detailed description taken in conjunction with the accompanying drawings, in which.

DETAILED DESCRIPTION OF THE DISCLOSURE

Although claimed subject matter will be described in terms of certain embodiments, other embodiments, including embodiments that do not provide all of the benefits and features set forth herein, are also within the scope of this disclosure. Various structural, logical, process step, and electronic changes may be made without departing from the scope of the disclosure. Accordingly, the scope of the disclosure is defined only by reference to the appended claims.

Embodiments disclosed herein disclose an automated technique of creating high-quality machine learning (ML) models used in metrology applications. A machine learning model can evaluate the performance of existing recipes based on pre-defined cost function and then generate an improved recipe. The methods disclosed herein can result in a higher-quality recipe than with previous manual techniques. Additionally, the time required to generate such a recipe is significantly shorter than for the recipes generated in a manual mode by an application engineer. Both runtime and training of the associated machine learning module can be automated.

In embodiments disclosed herein, multiple machine learning recipes can be used for conversion of measured signals into parameters of interest. A higher-level machine learning model can guide development of a lower-level machine learning model. The lower-level machine learning model can generate the parameters of interest, which can be in the form of a recipe. A cost function can be defined and used for evaluation of these machine learning recipes and output. A machine learning model can be trained to evaluate performance of existing recipes generated by another machine learning model and then generate an optimal recipe based on the cost function. In an instance, multiple machine learning recipes can be chosen from an existing set of already trained machine learning recipes. In another instance, a new set of machine learning recipes is trained.

In the disclosed embodiments, a machine learning model that can evaluate performance of existing recipes is trained. The inputs to this machine learning model are the initial set of recipes (e.g., recipes trained with the specified set of initial settings by a machine learning module) and the cost function used for recipe evaluation. The output of the machine learning model is the final recipe.

Figure 1:
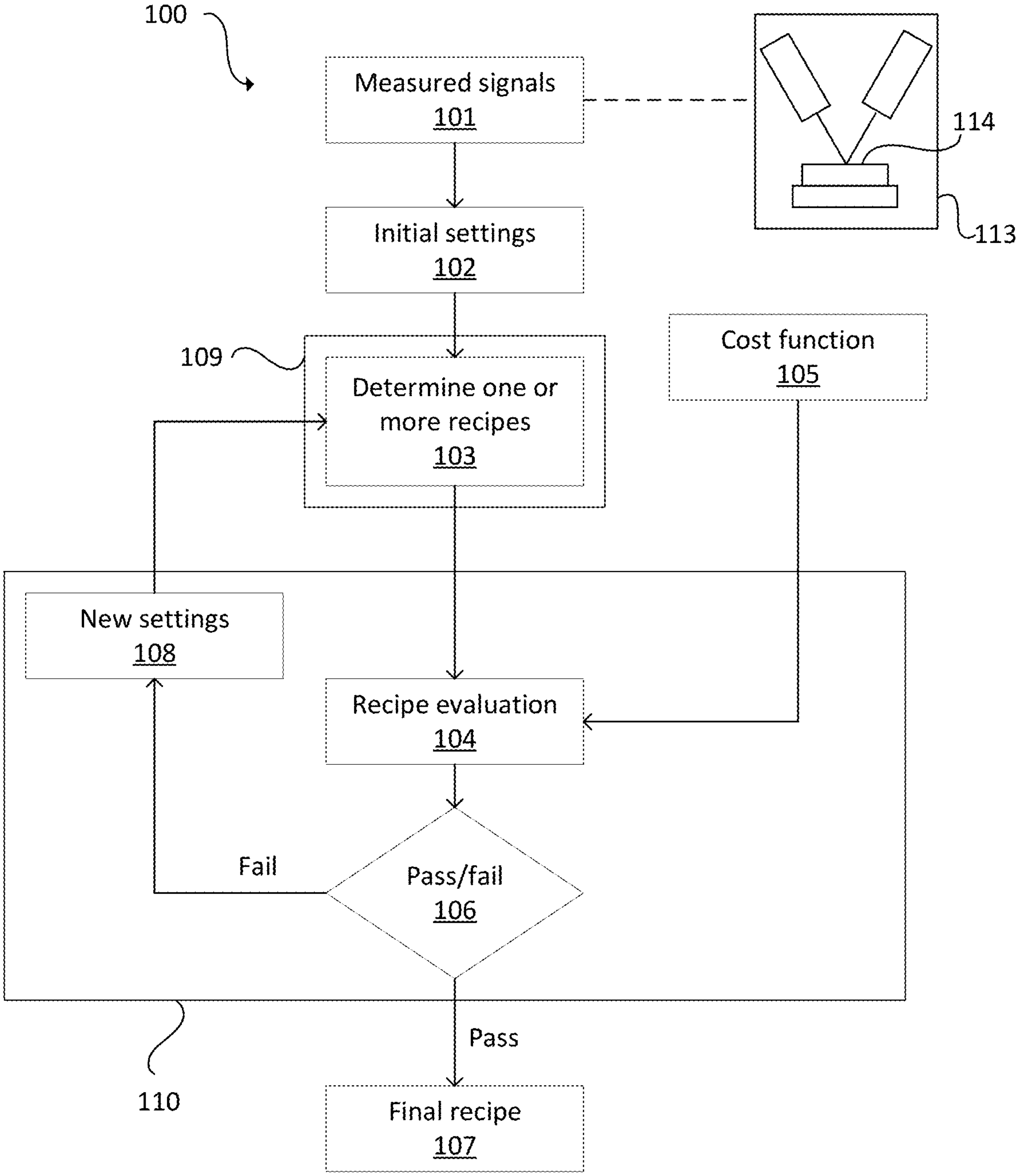
FIG. 1 is a flowchart of an embodiment of a method in accordance with the present disclosure.

FIG. 1 is a flowchart of an embodiment of a method 100. The method illustrates a first machine learning module 109 and a second machine learning module 110. The first machine learning module 109 and a second machine learning module 110 can each run a separate model. While illustrated as separate, a single machine learning module can run both models in another embodiment. The first machine learning module 109 and a second machine learning module 110 can be run on one or more processors. The processor, other system(s), or other subsystem(s) described herein may be part of various systems, including a personal computer system, image computer, mainframe computer system, workstation, network appliance, internet appliance, or other device. The subsystem(s) or system(s) may also include any suitable processor known in the art, such as a parallel processor. In addition, the subsystem(s) or system(s) may include a platform with high-speed processing and software, either as a standalone or a networked tool.

Measured signals 101 are used to generate the initial settings 102. A human operator or database can be used to generate the initial settings 102. The initial settings 102 can be designed to maximize the chance of the recipe passing the analysis at 104 on a first iteration. Providing a wider range of possible initial settings 102 may increase the chance for success at the expense of longer recipe generation time.

A semiconductor wafer can be measured with a semiconductor metrology tool to form the measured signals 101. This semiconductor metrology tool can be an optical or electron beam semiconductor metrology tool. In another instance, the semiconductor wafer is measured with a semiconductor inspection tool to form the measured signals 101. The semiconductor inspection tool can be an optical or electron beam semiconductor inspection tool. These semiconductor inspection tool and semiconductor metrology tool can represented by the tool 113. The tool 113 includes a stage configured to hold a wafer 114, an energy source that directs energy at the wafer on the stage, and a detector that receives the energy reflected from the wafer, though other components are possible.

The first machine learning module 109 then determines a set of recipes 103 using the initial settings 102. The first machine learning module 109 can be trained using the methodology disclosed in U.S. Pat. No. 10,101,670, which is incorporated by reference in its entirety, or other methodologies. While usually a set of recipes 103, a single recipe 103 also can be determined. Each recipe in the set of recipes converts the measured signals 101 into parameters of interest. The parameters of interest can include critical dimension, overlay, a material property, or a defect type. Other parameters of interest are possible, such as those that that are physical parameters used in the characterization of a semiconductor structure or for the semiconductor process equipment. For example, focus and dose parameters can be the parameters of interest for a lithography process. There are other parameters that can be used for etch, deposition, CMP, implant, or other process equipment.

The set of recipes from 103 are then analyzed with the second machine learning module 110 at 104 based on a cost function 105. If the set of recipes from 103 fail the evaluation 104 using the cost function 105, then the second machine learning module 110 determines new settings 108. If one of the set of recipes from 103 passes the evaluation 104 using the cost function 105, then that recipe becomes the final recipe 107. The pass/fail decision is shown at 106 separate from the recipe evaluation 104, but the pass/fail is merely illustrating the result of the evaluation 104.

Usually there is at least one number associated with a cost function. If multiple recipes from 103 “pass” evaluation, then the one with the best number may be chosen. For example, a cost function produces a number in a range from 0 to 1, with 1 being the best. 0.9 can be defined as a threshold for recipe to “pass” with this cost function. Thus, any recipe with number >0.9 will pass. Then the recipe with the highest number is selected. So in the example a recipe with 0.95 is chosen over a recipe with 0.93.

The final recipe 107 can include hardware settings for a tool, such as tool 113. For example, from one to forty tool settings can be included in the final recipe 107, though other values are possible. The final recipe 107 also can include data processing settings. As an example, cost function can correspond to parameter precision. Then a recipe with the lowest precision is selected because the lower precision can be better. There can be multiple output parameters optimized for the final recipe 107.

The initial settings may not result in a final recipe 107 that meets all specified requirements. In such instances, a retraining step is performed where an additional set of recipes 103 is generated using new settings 108. The new settings 108 can be selected by the second machine learning module 110. These can be the same settings that were used as the initial settings 102, but with different values. Some examples of settings are associated with tool 113 can include a subset of measured signals, wavelength range, angle of incidence, numerical aperture, etc. Other settings can be parameters of the machine learning models, such as a type of machine learning model, number of neurons, trees, leaves, nodes, learning rate, regularization parameters, type of regularization, objective function, etc.

Figure 2:
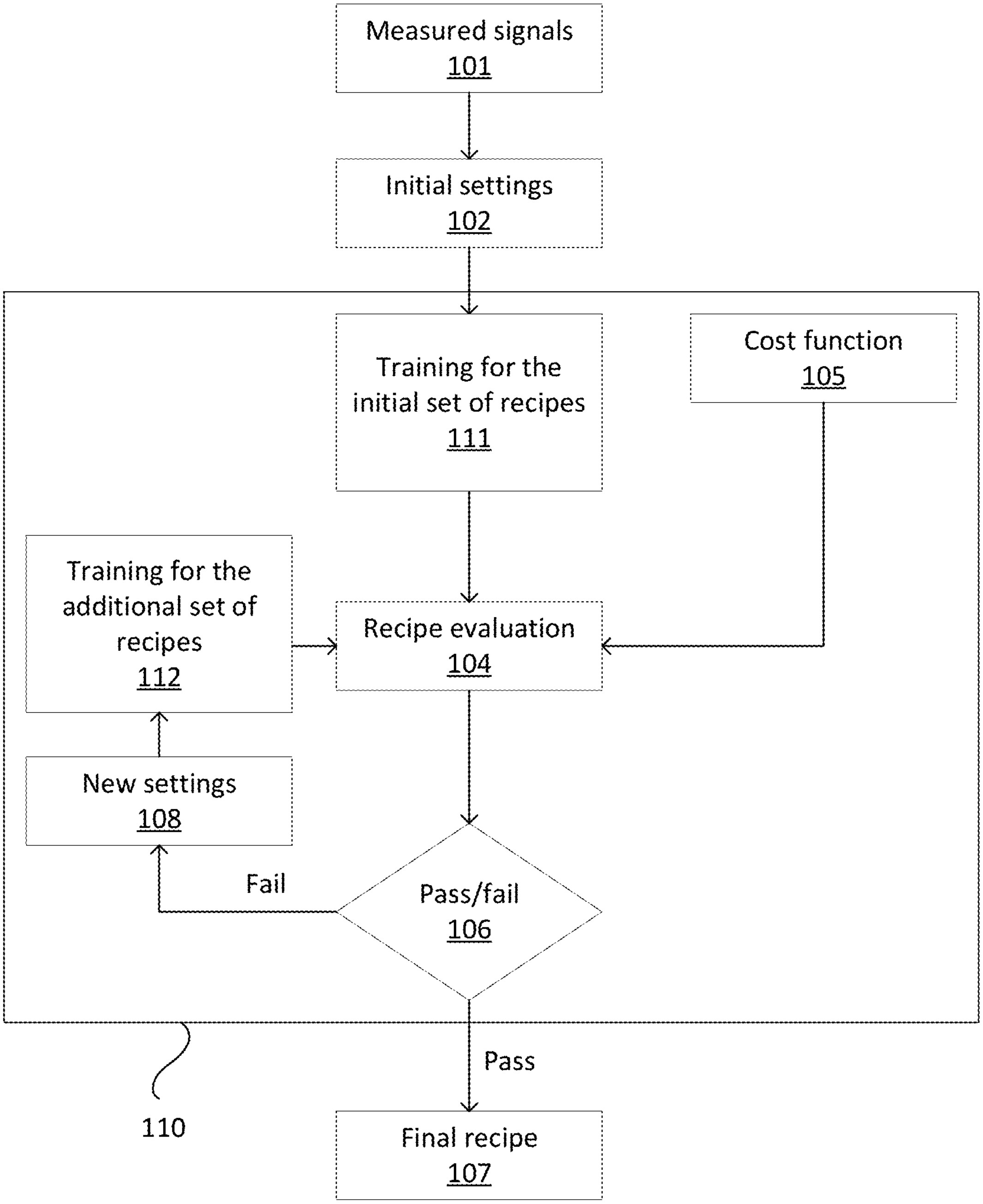
FIG. 2 is a flowchart of a retraining cycle for the method of FIG. 1.

Traditionally, the new settings 108 are chosen manually by a human operator. Optionally, in the proposed method, the choice of new settings 108 can be a part of the machine learning model as shown in FIG. 2. In FIG. 2, the second machine learning module 110 is trained with the initial set of recipes 111 and at least one additional set of recipes 112.

The cost function can be based on one or more parameters, such as metrology performance metrics (e.g., accuracy, precision, total measurement uncertainty), inspection performance metrics (e.g., defect capture rate), or any other recipe-relevant characteristic (e.g., measurement time). The cost function also can be based on a difference between two or more recipes to guarantee a gradual change in recipe during a retrain. In an instance, (e.g. for re-train method shown in FIG. 4), a cost function that changes from one iteration to another can be used.

Other parameters can include metrology performance metrics like a coefficient of determination (R2, R-squared) or slope relative to reference. Parameters also can include general model quality metrics like goodness of fit or chi-square. Parameters further can include machine learning model quality metrics like root mean squared error (RMSE), mean absolute error (MAE), convergence, or recall.

In the embodiment of FIG. 1, the new settings 108 are provided to the first machine learning module 109. The new settings 108 can be the initial settings 102 with new values or can include different settings than in the initial settings 102.

The second machine learning module 110 (or first machine learning module 109) can be updated at given intervals (e.g., once per day, at the run time, or during metrology tool downtime) by including additional measured signals in the training set.

In an embodiment, the second machine learning module 110 also is trained using tool performance metrics.

Recipes generated the method 100 have several advantages over previous techniques. The recipe generation time is faster because the second machine learning module can pick the final recipe 107 faster than even a highly-skilled human operator. A typical human-generated recipe can take up to several days to generate, while a machine learning-generated recipe can be produced within few hours. The final recipe 107 quality is more consistent and has better robustness because the selection of the recipe is more deterministic (i.e., depending on the trained machine learning model) and not on a skillset of a human operator creating the recipe. Use of machine learning model can result in faster turn-around time allows for going through many more sets of settings, so there is a higher chance of choosing a better set, 2) smaller chance of human error, and/or 3) more deterministic output (i.e., smaller impact of non-perfect human decisions). The final recipe 107 quality is better because of a faster iteration cycle due to fully automated iterations loop requiring no feedback from a person, which allows for more iterations done in the same time frame. The final recipe 107 quality also is better because of the ability of a machine learning model to use additional insight not available to a human operator (such as a complex, multi-variable cost function).

Figure 3:
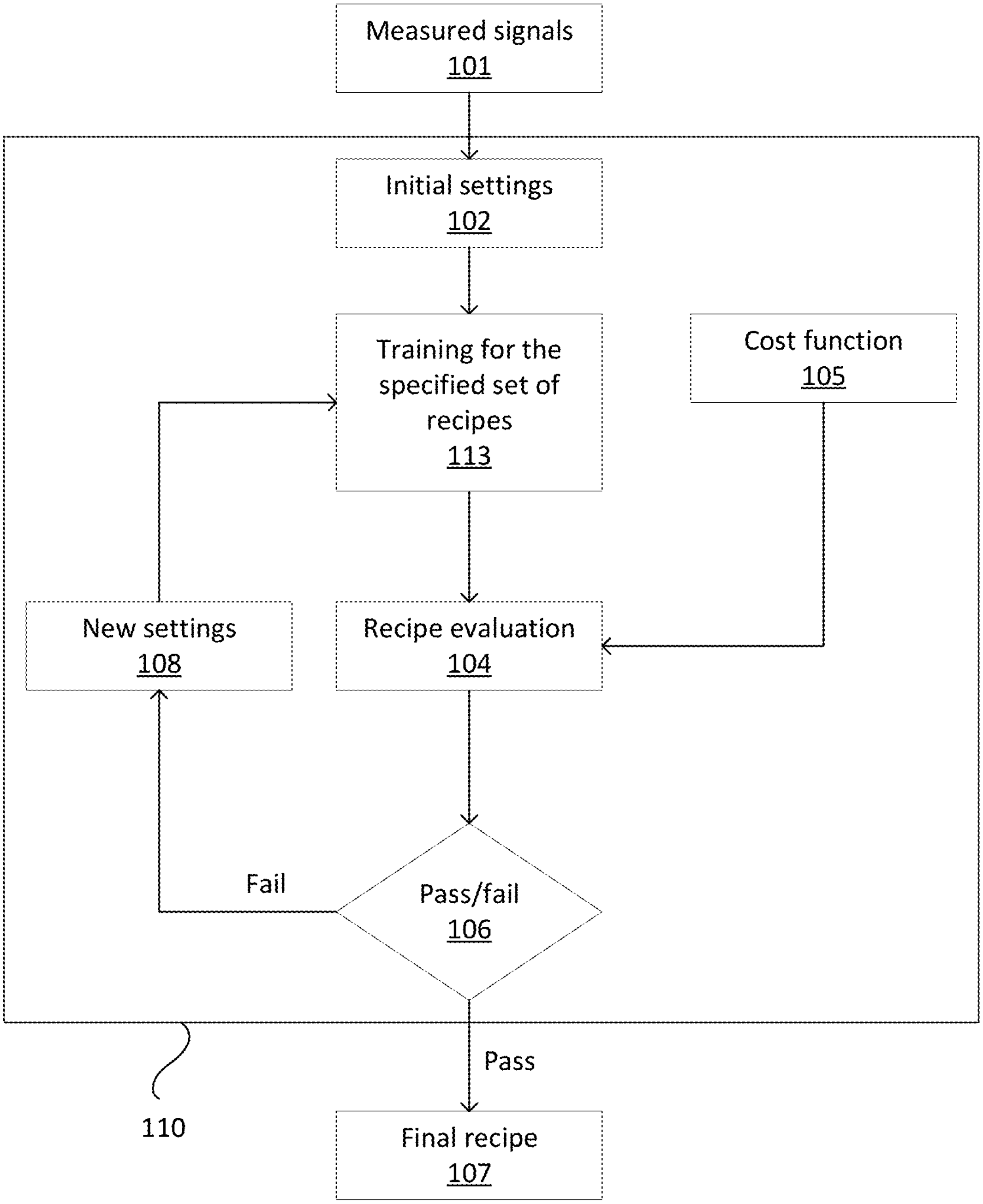
FIG. 3 is a flowchart of fully-automated recipe generation.

A fully-automated, machine learning-driven generation of recipes is shown in FIG. 3. The machine learning model in the second machine learning module 110 uses some pre-defined set of initial settings. This predefined set of initial settings probably will not result in a high-quality final recipe 107 on the first iteration. However, due to fully-automated training and recipe generation cycle, the machine learning model can quickly iterate through several cycles, gradually improving the recipe quality until the desired result (e.g., driven by the pre-defined cost function) is achieved. Such quick iteration cycles may not require any manual input at each iteration. Thus, a faster recipe generation time is possible because of the smaller set of initial settings with quick automated iterations.

Figure 4:
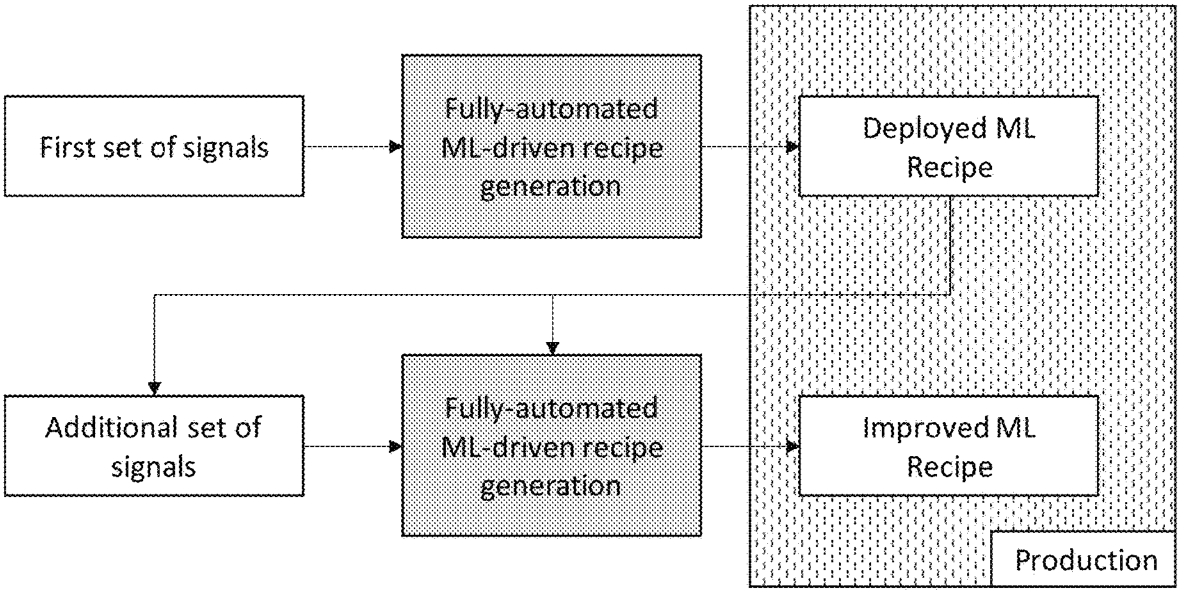
FIG. 4 is a flowchart of recipe retraining during runtime.

Another embodiment of this method comes with an extension into a production environment shown in FIG. 4. After the final recipe is deployed into production, additional signals will be generated by a metrology tool or other tool. These signals can be used to retrain the model for the second machine learning module, resulting in a higher-quality recipe. Such retraining might be done in the fully automated mode described above, at regular intervals (e.g. once per day), during metrology tool downtime, or at the run time.

The embodiment of FIG. 4 can enable quick turn-around time in the deployment of the original recipe because there is no need to wait for generation of the large set of measured signals. The originally-deployed recipe may be generated using a limited set of signals. The recipe may have a lower quality and robustness due to the limited initial set of signals, so another cost function can be used to generate it. With time and each subsequent re-train, the recipe quality can gradually improve.

While described using signals generated by semiconductor metrology tools, embodiments disclosed herein can be applied for generation of recipe for semiconductor inspection tools using the semiconductor inspection tool signals as inputs. In addition to measured signals, simulated or synthetic signals also can be used. A recipe can be generated using only simulated signals. For example, in the method shown on FIG. 4, the first set of signals can contain only simulated signals, and then the initial machine learning recipe can be deployed even before generation of any measured signals.

Recipe generation can be performed to account for tool performance metrics. In an example, the recipe can be optimized in such a way that lowers total measurement time. In another example, the recipe failure rate can be reduced by including such performance metric into the cost function. Total measurement time can be reduced if the number of measured signals is reduced. So, by including number of measured signals in the cost function, total measurement time can be reduced. For example, an initial recipe may use two azimuth angles for data collection, while an optimized recipe only uses a single azimuth angle, hence improving measurement time by roughly 2×. Recipe failure rate can be reduced by improving robustness metrics (e.g., accuracy, total measurement uncertainty (TMU), goodness of fit) into a cost function Embodiments disclosed herein can be performed by including the existing recipes from different production lines running the same product, different products, different process steps, or different targets into the training set. The different production lines can be in the same or different manufacturing facilities ("fabs"). In an example, a recipe trained for M1A layer (i.e., a first lithography step in the metallization of first metal layer) can be used for training a recipe for M1B layer (i.e., a second lithography step in the metallization of first metal layer). In another example, a recipe trained for the target stack without underlayers can be used for training a recipe for the target with the underlayers.

The first machine learning module 109 and second machine learning module 110 can be executed by a processor. The first machine learning module 109 and second machine learning module 110 can include a deep learning classification module (e.g., a convolutional neural network (CNN) module). The deep learning classification module can have one of the configurations described further herein. Rooted in neural network technology, deep learning is a probabilistic graph model with many neuron layers, commonly known as a deep architecture. Deep learning technology processes the information such as image, text, voice, and so on in a hierarchical manner. In using deep learning in the present disclosure, feature extraction is accomplished automatically using learning from data. For example, defects can be classified, sorted, or binned using the deep learning classification module based on the one or more extracted features.

Generally speaking, deep learning (also known as deep structured learning, hierarchical learning or deep machine learning) is a branch of machine learning based on a set of algorithms that attempt to model high level abstractions in data. In a simple case, there may be two sets of neurons: ones that receive an input signal and ones that send an output signal. When the input layer receives an input, it passes on a modified version of the input to the next layer. In a deep network, there are many layers between the input and output, allowing the algorithm to use multiple processing layers, composed of multiple linear and non-linear transformations.

Deep learning is part of a broader family of machine learning methods based on learning representations of data. An observation (e.g., a feature to be extracted for reference) can be represented in many ways such as a vector of intensity values per pixel, or in a more abstract way as a set of edges, regions of particular shape, etc. Some representations are better than others at simplifying the learning task (e.g., face recognition or facial expression recognition). Deep learning can provide efficient algorithms for unsupervised or semi-supervised feature learning and hierarchical feature extraction.

Research in this area attempts to make better representations and create models to learn these representations from large-scale data. Some of the representations are inspired by advances in neuroscience and are loosely based on interpretation of information processing and communication patterns in a nervous system, such as neural coding which attempts to define a relationship between various stimuli and associated neuronal responses in the brain.

There are many variants of neural networks with deep architecture depending on the probability specification and network architecture, including, but not limited to, Deep Belief Networks (DBN), Restricted Boltzmann Machines (RBM), and Auto-Encoders. Another type of deep neural network, a CNN, can be used for feature analysis. The actual implementation may vary depending on the size of input images, the number of features to be analyzed, and the nature of the problem. Other layers may be included in the deep learning classification module besides the neural networks disclosed herein.

In an embodiment, the deep learning model is a machine learning model. Machine learning can be generally defined as a type of artificial intelligence (AI) that provides computers with the ability to learn without being explicitly programmed. Machine learning focuses on the development of computer programs that can teach themselves to grow and change when exposed to new data. Machine learning explores the study and construction of algorithms that can learn from and make predictions on data. Such algorithms overcome following strictly static program instructions by making data driven predictions or decisions, through building a model from sample inputs.

In some embodiments, the deep learning model is a generative model. A generative model can be generally defined as a model that is probabilistic in nature. In other words, a generative model is one that performs forward simulation or rule-based approaches. The generative model can be learned (in that its parameters can be learned) based on a suitable training set of data. In one embodiment, the deep learning model is configured as a deep generative model. For example, the model may be configured to have a deep learning architecture in that the model may include multiple layers, which perform a number of algorithms or transformations.

In another embodiment, the deep learning model is configured as a neural network. In a further embodiment, the deep learning model may be a deep neural network with a set of weights that model the world according to the data that it has been fed to train it. Neural networks can be generally defined as a computational approach which is based on a relatively large collection of neural units loosely modeling the way a biological brain solves problems with relatively large clusters of biological neurons connected by axons. Each neural unit is connected with many others, and links can be enforcing or inhibitory in their effect on the activation state of connected neural units. These systems are self-learning and trained rather than explicitly programmed and excel in areas where the solution or feature detection is difficult to express in a traditional computer program.

Neural networks typically consist of multiple layers, and the signal path traverses from front to back. The goal of the neural network is to solve problems in the same way that the human brain would, although several neural networks are much more abstract. Modern neural network projects typically work with a few thousand to a few million neural units and millions of connections. The neural network may have any suitable architecture and/or configuration known in the art.

In a preferred embodiment, the machine learning model is implemented as a neural network model. In one example, the number of nodes of the neural network is selected based on the features extracted from the measurement data. In other examples, the machine learning model may be implemented as a polynomial model, a response surface model, or other types of models. The models are further described in U.S. Pat. No. 10,101,670, which is incorporated by reference in its entirety.

In one embodiment, the deep learning model used for the applications disclosed herein is configured as an AlexNet. For example, an AlexNet includes a number of convolutional layers (e.g., 5) followed by a number of fully connected layers (e.g., 3) that are, in combination, configured and trained to perform the desired analysis. In another such embodiment, the deep learning model used for the applications disclosed herein is configured as a GoogleNet. For example, a GoogleNet may include layers such as convolutional, pooling, and fully connected layers such as those described further herein configured and trained to perform the desired analysis. While the GoogleNet architecture may include a relatively high number of layers (especially compared to some other neural networks described herein), some of the layers may be operating in parallel, and groups of layers that function in parallel with each other are generally referred to as inception modules. Other of the layers may operate sequentially. Therefore, GoogleNets are different from other neural networks described herein in that not all of the layers are arranged in a sequential structure. The parallel layers may be similar to Google's Inception Network or other structures.

In some such embodiments, the deep learning model used for the applications disclosed herein is configured as a deep residual network. For example, like some other networks described herein, a deep residual network may include convolutional layers followed by fully-connected layers, which are, in combination, configured and trained for feature property extraction. In a deep residual network, the layers are configured to learn residual functions with reference to the layer inputs, instead of learning unreferenced functions. In particular, instead of hoping each few stacked layers directly fit a desired underlying mapping, these layers are explicitly allowed to fit a residual mapping, which is realized by feedforward neural networks with shortcut connections. Shortcut connections are connections that skip one or more layers. A deep residual net may be created by taking a plain neural network structure that includes convolutional layers and inserting shortcut connections which thereby takes the plain neural network and turns it into its residual learning counterpart.

In some embodiments, the information determined by the deep learning model includes feature properties extracted by the deep learning model. In one such embodiment, the deep learning model includes one or more convolutional layers. The convolutional layer(s) may have any suitable configuration known in the art. In this manner, the deep learning model (or at least a part of the deep learning model) may be configured as a CNN. For example, the deep learning model may be configured as a CNN, which is usually stacks of convolution and pooling layers. The embodiments described herein can take advantage of deep learning concepts such as a CNN to solve the normally intractable representation inversion problem. The deep learning model may have any CNN configuration or architecture known in the art. The one or more pooling layers may also have any suitable configuration known in the art (e.g., max pooling layers) and are generally configured for reducing the dimensionality of the feature map generated by the one or more convolutional layers while retaining the most important features.

In general, the deep learning model described herein is a trained deep learning model. For example, the deep learning model may be previously trained by one or more other systems and/or methods. The deep learning model is already generated and trained and then the functionality of the model is determined as described herein, which can then be used to perform one or more additional functions for the deep learning model.

Training data may be inputted to model training (e.g., CNN training), which may be performed in any suitable manner. For example, the model training may include inputting the training data to the deep learning model (e.g., a CNN) and modifying one or more parameters of the model until the output of the model is the same as (or substantially the same as) external validation data. Model training may generate one or more trained models, which may then be sent to model selection, which is performed using validation data. The results that are produced by each one or more trained models for the validation data that is input to the one or more trained models may be compared to the validation data to determine which of the models is the best model. For example, the model that produces results that most closely match the validation data may be selected as the best model. Test data may then be used for model evaluation of the model that is selected (e.g., the best model). Model evaluation may be performed in any suitable manner. A best model may also be sent, to model deployment in which the best model may be sent to the tool for use (post-training mode).

An additional embodiment relates to a non-transitory computer-readable medium storing program instructions executable on a controller for performing a computer-implemented method for determining a recipe using a cost function, as disclosed herein. An electronic data storage unit or other storage medium may contain non-transitory computer-readable medium that includes program instructions executable on a processor. The computer-implemented method may include any step(s) of any method(s) described herein.

Each of the steps of the method may be performed as described herein. The methods also may include any other step(s) that can be performed by the processor and/or computer subsystem(s) or system(s) described herein. The steps can be performed by one or more computer systems, which may be configured according to any of the embodiments described herein. In addition, the methods described above may be performed by any of the system embodiments described herein.

Although the present disclosure has been described with respect to one or more particular embodiments, it will be understood that other embodiments of the present disclosure may be made without departing from the scope of the present disclosure. Hence, the present disclosure is deemed limited only by the appended claims and the reasonable interpretation thereof.

What is claimed is:

1. A system comprising:

a tool that includes a stage configured to hold a wafer, an energy source that directs energy at the wafer on the stage, and a detector that receives the energy reflected from the wafer to generate measured signals, and wherein the tool is a semiconductor metrology tool or a semiconductor inspection tool;

a first machine learning module configured to determine a set of recipes from the measured signals, wherein the first machine learning module receives the measured signals, wherein each recipe in the set of recipes converts the measured signals into parameters of interest, and wherein each recipe in the set of recipes is associated with hardware settings for the tool; and a second machine learning module that receives the set of recipes, wherein the second machine learning module determines new settings for one or more of the set of recipes if the set of recipes fails evaluation using a cost function, and wherein the second machine learning module determines a final recipe from the set of recipes that passes evaluation using the cost function, wherein the second machine learning module provides the new settings to the first machine learning module, wherein the first machine learning module uses the new settings to train for the determination of an additional set of recipes from the measured signals whereby the second machine learning module guides development of the first machine learning module, and wherein the tool uses the hardware settings of the final recipe for measurements during production of wafers.

2. The system of claim 1, wherein the energy is light.

3. The system of claim 1, wherein the energy is electrons.

4. The system of claim 1, wherein the second machine learning module uses the new settings to train the evaluation by the second machine learning module.

5. The system of claim 1, wherein the second machine learning module uses the new settings to train recipe generation by the second machine learning module.

6. The system of claim 1, wherein the parameters of interest include critical dimension, overlay, a material property, or a defect type.

7. The system of claim 1, wherein the cost function is based on one or more of accuracy, precision, total measurement uncertainty, defect capture rate, or measurement time.

8. The system of claim 1, wherein the second machine learning module further evaluates based on the measured signals and/or tool performance metrics.

9. The system of claim 1, wherein the first machine learning model and the second machine learning model are each a neural network model.

10. A method comprising:

generating measured signals by measuring a wafer with a tool that directs energy at the wafer on a stage and receiving the energy reflected from the wafer at a detector, wherein the tool is a semiconductor metrology tool or a semiconductor inspection tool;

determining a set of recipes using a first machine learning module based on the measured signals, wherein each recipe in the set of recipes converts the measured signals into parameters of interest, and wherein each recipe in the set of recipes is associated with hardware settings for the tool;

analyzing the set of recipes with a second machine learning module based on a cost function, wherein the second machine learning module is configured to determine new settings for one or more of the set of recipes if the set of recipes fails evaluation using the cost function and is configured to determine a final recipe from the set of recipes that passes evaluation using the cost function;

providing the new settings to the first machine learning module and training the first machine learning module for the determination of an additional set of recipes using the new settings whereby the second machine learning module guides development of the first machine learning module;

deploying the final recipe to the tool; and using the hardware settings of the final recipe in the tool for measurements during production of wafers.

11. The method of claim 10, wherein the tool is the semiconductor metrology tool, and wherein the semiconductor metrology tool is an optical semiconductor metrology tool or an electron beam semiconductor metrology tool.

12. The method of claim 10, wherein the tool is the semiconductor inspection tool, and wherein the semiconductor inspection tool is an optical semiconductor inspection tool or an electron beam semiconductor inspection tool.

13. The method of claim 10, further comprising using the new settings to train the evaluation by the second machine learning module.

14. The method of claim 10, further comprising using the new settings to train recipe generation by the second machine learning module.

15. The method of claim 10, further comprising training the second machine learning module to evaluate performance of existing recipes.

16. The method of claim 15, wherein the existing recipes are from at least one different production line running a same product, at least one different production line running a different product, at least one different production line running a different process step, or at least one different production line running a different target.

17. The method of claim 10, further comprising training the second machine learning module to determine the final recipe from the set of recipes.

18. The method of claim 17, wherein the training uses recipes generated by the first machine learning module.

19. The method of claim 10, wherein the parameters of interest include critical dimension, overlay, a material property, or a defect type.

20. The method of claim 10, wherein the cost function is based on one or more of accuracy, precision, total measurement uncertainty, defect capture rate, or measurement time.

21. The method of claim 10, wherein the second machine learning module further evaluates based on the measured signals and/or tool performance metrics.

22. A non-transitory computer readable medium storing a program configured to instruct a processor to execute the method of claim 10.

* * * * *